(12) United States Patent
Szelag et al.

(10) Patent No.: US 12,376,423 B2
(45) Date of Patent: Jul. 29, 2025

(54) PROCESS FOR FABRICATING A SEMICONDUCTOR DIODE VIA WET AND DRY ETCHES

(71) Applicant: Commissariat à l'Energie Atomique et aux Energies Alternatives, Paris (FR)

(72) Inventors: Bertrand Szelag, Grenoble (FR); Laetitia Adelmini, Grenoble (FR)

(73) Assignee: Commissariat à l'Energie Atomique et aux Energies, Alternatives Paris (FR)

( * ) Notice: Subject to any disclaimer, the term of this patent is extended or adjusted under 35 U.S.C. 154(b) by 414 days.

(21) Appl. No.: 17/931,718

(22) Filed: Sep. 13, 2022

(65) Prior Publication Data
US 2023/0083344 A1 Mar. 16, 2023

(30) Foreign Application Priority Data
Sep. 14, 2021 (FR) ..................... 21 09625

(51) Int. Cl.
H01L 21/302 (2006.01)
H10H 20/01 (2025.01)

(52) U.S. Cl.
CPC .............. H10H 20/0133 (2025.01)

(58) Field of Classification Search
CPC ...... H01S 2301/176; H01S 5/02; H01S 5/021; H01S 5/026; H01S 5/1032; H01S 5/2275; H10H 20/0133
See application file for complete search history.

(56) References Cited

U.S. PATENT DOCUMENTS

| 10,418,510 | B1* | 9/2019 | Oyer ................... H10H 20/82 |
| 2007/0210299 | A1* | 9/2007 | Hirose ................. H01S 5/0201 |
| | | | 257/E31.022 |
| 2015/0155331 | A1 | 6/2015 | Guenard |
| 2016/0126422 | A1* | 5/2016 | Jeon ..................... H10H 20/831 |
| | | | 257/98 |
| 2020/0076162 | A1* | 3/2020 | Chen ....................... H01S 5/187 |

FOREIGN PATENT DOCUMENTS

FR 3 107 998 A1 9/2021
WO WO 2013/189949 A1 12/2013

OTHER PUBLICATIONS

French Preliminary Search Report issued May 16, 2022 in French Application 21 09625, filed on Sep. 14, 2021 (with English Translation of Categories of cited documents and Written Opinion), 10 pages.

Szelag, B. et al. "Hybrid III-V/Silicon Technology for Laser Integration on a 200-mm Fully CMOS-Compatible Silicon Photonics Platform" IEEE Journal of Selected Topics in Quantum Electronics, vol. 25, No. 5, 2019 (10 pages).

* cited by examiner

Primary Examiner — Matthew C Landau
Assistant Examiner — Dmitriy Yemelyanov
(74) Attorney, Agent, or Firm — Oblon, McClelland, Maier & Neustadt, L.L.P.

(57) ABSTRACT

The invention relates to a process for fabricating a semiconductor diode (1) via transfer of a semiconductor stack (20) then local etching to form a semiconductor pad (30), the production of the semiconductor pad (30) comprising a plurality of sequences comprising a dry etch that leaves a residual segment (23.1; 22.1), formation of a hard-mask spacer (42.1; 43.1), then a wet etch of the residual segment (23.1; 22.1).

8 Claims, 5 Drawing Sheets

PROCESS FOR FABRICATING A SEMICONDUCTOR DIODE VIA WET AND DRY ETCHES

TECHNICAL FIELD

The field of the invention is that of processes for fabricating semiconductor diodes such as emissive diodes (laser diodes and light-emitting diodes) or photodiodes. The invention is in particular applicable in the context of on-silicon photonics and of fabrication of hybrid laser sources.

PRIOR ART

The fabrication of semiconductor diodes such as emissive diodes and photodiodes may require a semiconductor pad to be structured via dry-etching and wet-etching operations. However, it is known that these etching techniques may result in unwanted over-etching that degrades the desired lateral and/or vertical dimensions of the semiconductor pad, this then having a negative impact on the performance of the semiconductor diode. Specifically, chemical etching may degrade unprotected materials, and notably result in an undesired undercut (lateral etching) when the sidewalls of a layer of a material sensitive to the etchant are not protected. In addition, with dry etching, the etch depth may, in the plane of the carrier substrate, exhibit non-uniformity, possibly leading to an undesired vertical etch.

This issue is particularly present in the field of on-silicon photonics and of production of hybrid laser sources. In this regard, document FR3107998 presents an example of a process for fabricating a hybrid laser diode 1 that implements dry-etching and wet-etching steps. As illustrated in FIG. 1, the laser diode 1 comprises a semiconductor pad 30 forming a waveguide referred to as the active waveguide that contains the gain medium, and which rests on a functionalized silicon-on insulator (SOI) substrate 10 in which an integrated photonic circuit is located. The latter comprises a silicon waveguide 12 optically coupled to the active waveguide. The hybrid laser diode 1 and the integrated photonic circuit together form a photonic chip This semiconductor pad 30 (active waveguide) is formed from a stack of segments of thin layers produced based on a III-V compound, these segments including: a p-doped upper segment 33, an active segment 32 comprising confinement layers and an intermediate active layer containing quantum wells, and an n-doped lower segment 31. The latter has a width larger than that of the segments above, so that contact may be made thereto via metallizations 2 that participate in electrical biasing of the active waveguide of the laser diode 1.

Thus, after a III-V chip has been transferred to the functionalized substrate, the active waveguide is produced by carrying out a step of dry etching to form the p-doped upper segment 33 and one portion of the active segment 32, this dry etching being stopped in a lower confinement layer in order not to run the risk of etching the n-doped lower layer (which would risk increasing the access resistance associated with the n-doped lower segment 31 of the laser diode 1). Subsequently, a wet-etching step is carried out to remove the residual portion of the lower confinement layer and thus free an upper surface of the n-doped lower layer. However, in this step, there is a risk that the active segment 32 will be undercut, this possibly leading to a degradation of the performance of the laser diode 1.

SUMMARY OF THE INVENTION

The objective of the invention is to at least partially remedy the drawbacks of the prior art, and more particularly to provide a process for fabricating a semiconductor diode the semiconductor pad of which has the desired dimensions, so as to limit the risks of degradation of the performance expected from the semiconductor diode following the fabricating process.

To this end, the subject of the invention is a process for fabricating a semiconductor diode comprising the following steps: transfer of a semiconductor stack to a carrier substrate, comprising, starting from the carrier substrate: a lower layer doped a first conductivity type; an active layer comprising at least one quantum well; an upper layer doped a second conductivity type opposite the first conductivity type; and production, via local etching of the semiconductor stack, of a semiconductor pad comprising a doped lower segment; an active segment having a lateral dimension smaller than that of the lower segment; and a doped upper segment having a lateral dimension smaller than that of the active segment.

According to the invention, the production of the semiconductor pad comprises the following steps:

depositing a first hard mask on the upper layer;

dry etching the upper layer to form the upper segment, with etching stopped on the active layer, a lateral segment of the upper layer being not entirely etched and forming a first residual segment resting on the active layer;

depositing and structuring a second hard mask so as to form a first hard-mask segment, referred to as the first spacer, which encapsulates the upper segment and leaves free an upper surface of the active layer and therefore one portion of the first residual segment;

wet etching the first residual segment selectively with respect to the active layer, so as to free a surface of the active layer not covered by the first spacer;

dry etching the active layer to form the active segment, with etching stopped on the lower layer, a lateral segment of the active layer being not entirely etched and forming a second residual segment resting on the lower layer;

depositing and structuring a third hard mask so as to form a second hard-mask segment, referred to as the second spacer, which laterally encircles the first spacer and the active segment, and leaves free an upper surface of the lower layer and therefore one portion of the second residual segment;

wet etching the second residual segment selectively with respect to the lower layer, so as to free a surface of the lower layer not covered by the second spacer.

The following are certain preferred but non-limiting aspects of this fabricating process.

The second hard mask and the third hard mask may have, before they are structured, a thickness smaller than that of the semiconductor stack before the step of dry etching the upper layer.

The process may comprise a step of locally etching the portion of the lower layer not covered by the second spacer to form the lower segment.

The first, second and third hard masks may be produced based on a silicon nitride.

The second and third hard masks are made of a silicon nitride, or are formed of a bilayer comprising a silicon-nitride first sub-layer and a second sub-layer made of an oxide or of a silane.

The semiconductor pad may be produced based on a III-V compound, a II-VI compound, or a IV compound or element.

The semiconductor pad may be produced based on a III-V compound, and the carrier substrate may be a silicon-on-insulator substrate.

The semiconductor diode may be a hybrid laser diode the semiconductor pad of which forms a waveguide optically coupled to an integrated waveguide located in the carrier substrate.

BRIEF DESCRIPTION OF THE DRAWINGS

Other aspects, aims, advantages and features of the invention will become more clearly apparent on reading the following detailed description of preferred embodiments thereof, which description is given by way of non-limiting example with reference to the appended drawings, in which.

DETAILED DESCRIPTION OF PARTICULAR EMBODIMENTS

Figure 1:
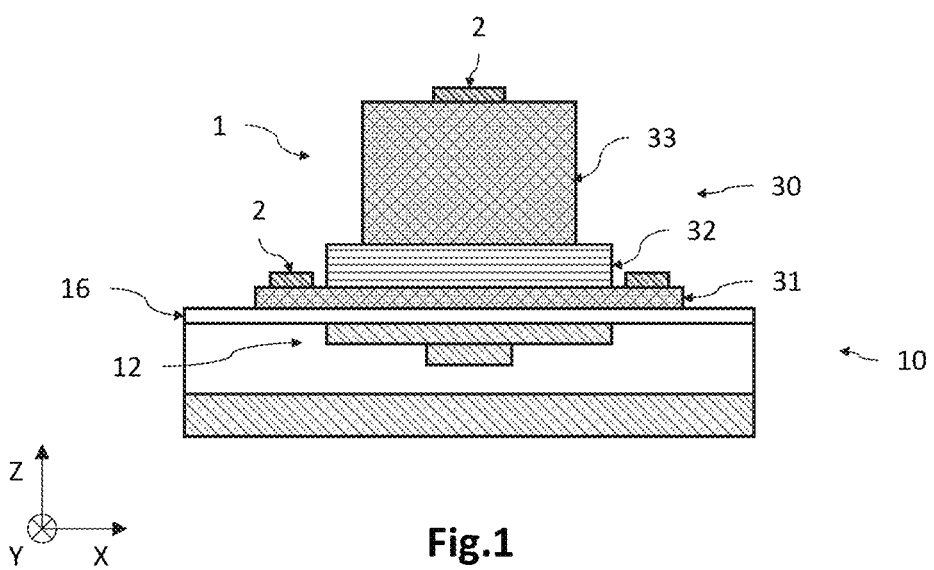
FIG. 1, described above, is a schematic and partial cross-sectional view of a hybrid laser source of a photonic chip according to one example of the prior art.

In the figures and in the remainder of the description, the same references have been used to designate identical or similar elements. In addition, the various elements have not been shown to scale for the sake of clarity of the figures. Moreover, the various embodiments and variants are not mutually exclusive and may be combined with one another. Unless indicated otherwise, the terms "substantially", "about" and "of the order of" mean to within 10%, and preferably to within 5%. Moreover, the terms "comprised between . . . and . . . " and equivalents mean inclusive of limits, unless indicated otherwise.

The invention relates to a process for fabricating a semiconductor diode by structuring a semiconductor pad by means of various dry-etching and wet-etching steps, so that the semiconductor pad has, in the end, the desired vertical and lateral dimensions.

In the context of the invention, the semiconductor pad is formed from a stack of segments of semiconductor layers resting on a carrier substrate. It comprises, starting from the carrier substrate, a lower segment doped a first conductivity type, n-type for example, an active segment comprising at least one quantum well, and an upper segment doped a second conductivity type opposite the first type, p-type for example.

In addition, the semiconductor pad has lateral dimensions such that, on the one hand, the doped lower segment has a lateral dimension larger than those of the active segment and of the doped upper segment, and, on the other hand, the active segment has a lateral dimension larger than that of the doped upper segment. The doped lower segment is therefore wider than the segments above so as to allow electrical contact to be made thereto laterally.

Moreover, it will be recalled that dry etching is essentially physical etching that has a highly anisotropic character. It may consist in a bombardment by ions of the free surface of a material, i.e. of a surface not protected by an etch mask (called a hard mask). It may be a question of reactive ion etching (RIE), and optionally of ICP-RIE (ICP standing for inductively coupled plasma). Moreover, wet etching is chemical etching in which a (partially protected) component is introduced into a solution that will attack the (unprotected) free surface of the component chemically. This type of etching is highly isotropic and has a good selectivity between materials.

FIGS. 2A to 2J illustrate various steps of a process for fabricating a semiconductor diode 1 according to one embodiment. As indicated above, the semiconductor diode 1 may be an emissive diode such as a laser diode or a light-emitting diode, or may be a photodiode.

In this example, the semiconductor diode 1 is a hybrid laser diode of a photonic chip. A photonic chip is an optoelectronic device comprising at least one hybrid laser diode 1 resting on the functionalized substrate 10 and optically coupled to an integrated waveguide located in the functionalized substrate 10. This integrated waveguide forms one portion of an integrated photonic circuit.

The semiconductor diode 1, is, generally, produced based on a III-V semiconductor compound (for example InP, GaAs, GaN, etc.), a II-VI semiconductor compound (for example CdTe, HgTe, CdHgTe, etc.), or a IV compound or element (for example Ge, SiGe, GeSn, etc.), i.e. it mainly comprises the semiconductor compound in question. It is a heterostructure formed from an n-doped layer segment 31, from a p-doped layer segment 33, and from a segment 32 of intermediate active layer containing at least one quantum well. In this example, it is produced based on a III-V compound, here based on InP, and the functionalized substrate 10 is an SOI substrate.

An orthogonal three-dimensional direct coordinate system XYZ, in which the XY-plane is a plane parallel to the plane of the functionalized substrate 10, and in which the Z-axis is oriented from the functionalized substrate 10 toward the laser diode 1, is defined here and will be referred to in the rest of the description. Moreover, the terms "lower" and "upper" are understood to relate to positions of increasing distance from the functionalized substrate 10 in the +Z-direction.

Figure 2A:
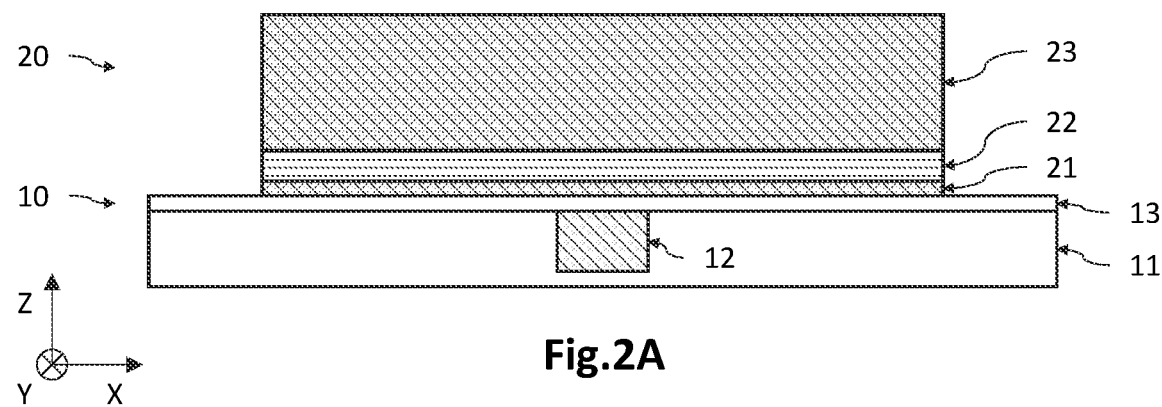
FIGS. 2A to 2J illustrate various steps of a process for fabricating a semiconductor diode according to one embodiment.

With reference to FIG. 2A, a semiconductor stack 20 is transferred to the functionalized substrate 10. The functionalized substrate 10 is here an SOI substrate, and comprises a carrier substrate (not shown) that is for example made of silicon and that has a thickness of the order of several hundred microns, a buried-oxide layer (also simply called the buried oxide or "BOX") that covers the carrier substrate, and an integrated waveguide 12. The integrated waveguide 12 is here formed from single-crystal silicon, and is encircled by an oxide 11 that forms a cladding of low refractive index. In this example, it is coated with a dielectric bonding layer 13, here made of a silicon oxide, that defines the upper face of the functionalized substrate 10. It has a thickness of the order of a few tens of nanometers, and for example a thickness comprised between about 20 nm and 100 nm. In this example, the integrated waveguide 12 is a strip guide, but as a variant, it may be a ridge guide formed from a slab and a rib.

The semiconductor stack 20 here takes the form of a chip, i.e. of one portion of a wafer, but as a variant it may be an entire wafer. The semiconductor stack 20 is here formed from a lower layer 21 doped a first conductivity type, here a layer of n-doped InP of a thickness of about 150 nm, from an active layer 22 of a thickness of about 300 nm (formed from a lower confinement sub-layer made of InGaAsP, from a sub-layer comprising quantum wells made of InGaAsP/InAsP, and from an upper confinement sub-layer made of InGaAsP), and lastly from an upper layer 23 doped a second conductivity type opposite the first type, here a layer of p-doped InP of a thickness of about 2 μm, which is optionally covered by a layer of p-doped InGaAs (not shown) of a thickness of 300 nm that is intended to improve electrical contact. The confinement layers have a refractive index chosen to improve the confinement of the optical mode guided through the quantum-well sub-layer (gain medium). Moreover, the semiconductor stack 20 may also comprise the InP growth substrate (not shown).

The semiconductor stack 20 is thus transferred to the functionalized substrate 10, and is fastened thereto by direct bonding, which is for example of oxide/oxide type. Next, the growth substrate is removed, for example by wet etching in hydrochloric acid optionally preceded by mechanical thinning, so as to free the upper surface of the p-doped upper layer 23.

Figure 2B:
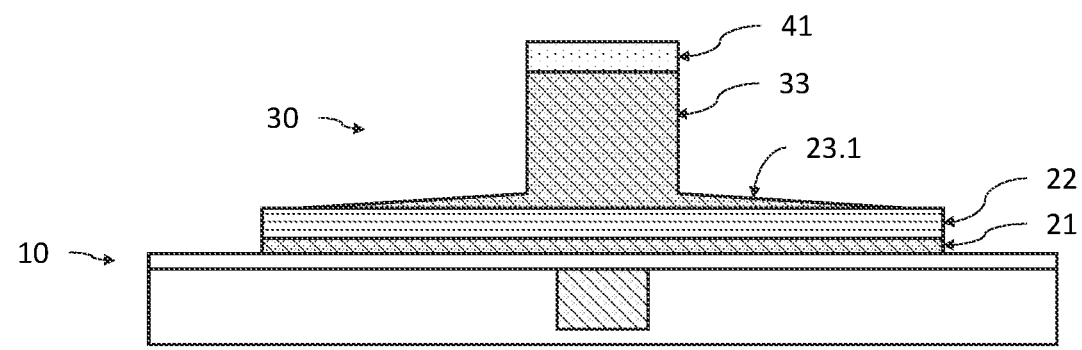

With reference to FIG. 2B, the p-doped upper layer 23 is structured by dry etching, so as to form a p-doped upper segment 33. To do so, a hard mask 41 is deposited on an area of the p-doped upper layer 23 intended to form the semiconductor pad 30 of the laser diode 1, the hard mask 41 for example being made of a silicon nitride of a thickness comprised between 400 nm and 800 nm deposited by plasma-enhanced chemical vapor deposition (PECVD). Next, dry etching is carried out, so as to etch the p-doped upper layer 23 locally in the unprotected regions and to form the p-doped upper segment 33, with etching stopped on the active layer 22 (N.B. the functionalized substrate 10 is protected from the dry etching). The etching may notably be stopped by detecting when the attack ends, i.e. when the InGaAsP material of the active layer 22 is detected. The p-doped upper layer 23 is thus removed, with the exception of the segment 33 covered by the hard mask 41. The latter is advantageously preserved.

As mentioned above, the dry-etching technique may lead to a non-uniformity in etch depth in the XY-plane, and as a result some InP material of the p-doped upper layer 23 to be etched may remain. Thus, following the dry etching, the semiconductor pad 30 has an upper segment 33 with substantially the same lateral dimension as the hard mask 41, and an unetched lateral residual segment 23.1 that rests on the active layer 22. This residual segment 23.1 has been shown here schematically as a segment extending from the p-doped upper segment 33 and the thickness of which decreases with distance therefrom, but it may in fact present differently. Irrespectively, the process according to the invention addresses not only residual-segment thickness variations at the intra-wafer level (for example from the center of the wafer to its border) but also residual-segment thickness variations from one wafer to the next (for example when the method is implemented on a plurality of wafers in parallel).

This residual segment 23.1 may have a maximum thickness of the order of 115 nm, this corresponding to a non-uniformity in etch depth of the order of 5% of the initial thickness to be etched, i.e. here 2300 nm (thickness of the p-doped upper layer 23 plus thickness of the upper contact layer). It will be noted that as this non-uniformity is then of the order of half the thickness of the active layer 22, it is reasonable not to seek to remove this residual segment 23.1 during the dry etch as to do so would risk this slight undesired vertical etch degrading the subjacent active layer 22.

Thus, according to the invention it is chosen to structure the layers 21, 22, 23 of the semiconductor stack 20 by dry etching rather than by wet etching so as to benefit from a better control of lateral dimensions, but it is not sought to remove residual lateral segments thereby in order to avoid any undesired vertical etching of the subjacent layers. Subsequently, the residual segments are removed locally by wet etching, so as to obtain a good thickness uniformity as regards the obtained layer segments.

Figure 2C:
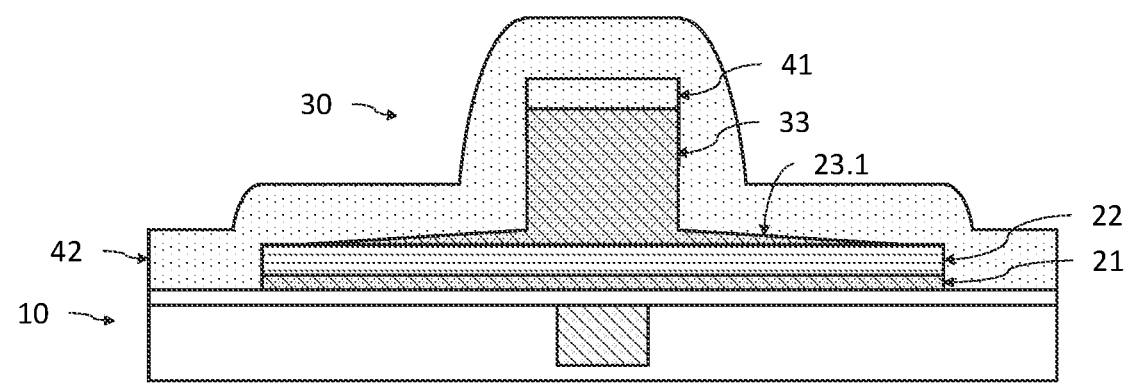

With reference to FIG. 2C, a hard-mask layer 42 is deposited so as to continuously cover the p-doped upper segment 33, the residual segment 23.1, the active layer 22, the n-doped lower layer 21, and the functionalized substrate 10. A hard mask, for example a silicon nitride of a thickness comprised between 600 nm and 2 μm deposited by PECVD, is used in so far as a dry etch will subsequently be carried out. The thickness of the hard-mask layer 42 is chosen to be smaller than the total thickness of the semiconductor pad 30 in the process of being produced. As a variant, the hard-mask layer 42 may be a bilayer formed from a SiN first sub-layer, which is for example of the order of 200 nm in thickness, and from a second sub-layer of a tetraethyl orthosilicate (TEOS) or of a silane, which is of the order of 800 nm in thickness.

Figure 2D:
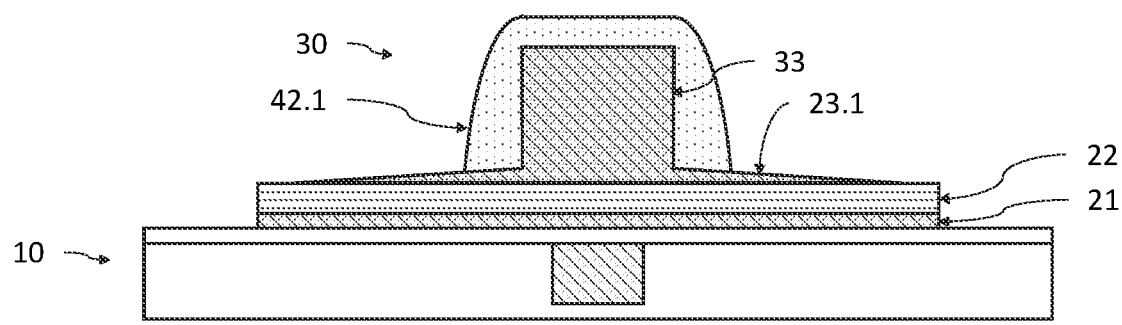

With reference to FIG. 2D, the hard-mask layer 42 is then structured to form a hard-mask segment 42.1, which is referred to as the first spacer, and which encapsulates only the p-doped upper segment 33. It therefore extends over the upper face and over the sidewalls of the p-doped upper segment 33, and covers only one portion of the residual segment 23.1 and therefore also only one portion of the active layer 22. Another portion of the residual segment 23.1 has a free (uncovered) surface. This step may be performed by dry etching the hard-mask layer 42, with etching stopped when the oxide of the functionalized substrate 10 and/or the InGaAsP of the active layer 22 is detected. The spacer 42.1 is therefore preferably obtained via conformal deposition of the hard-mask layer 42, the latter having a thickness smaller than the thickness of the upper segment 33, followed by structuring with an anisotropic etch.

Figure 2E:
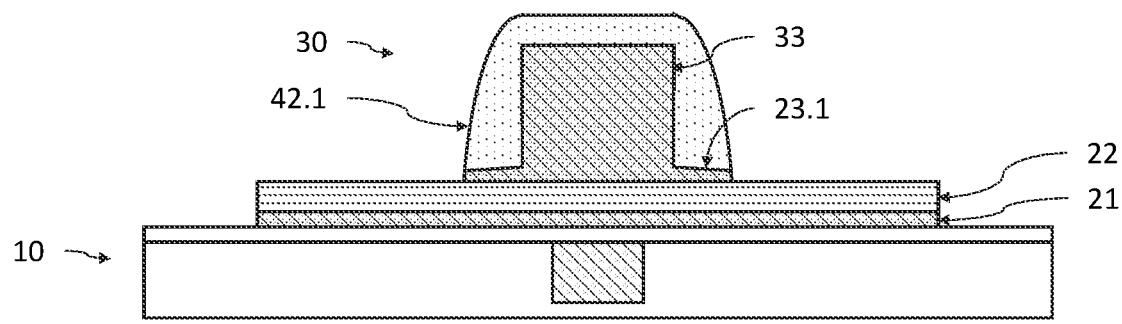

With reference to FIG. 2E, one portion of the residual segment 23.1, i.e. the portion not protected by the spacer 42.1, is wet etched so as to free the surface of the active layer 22 not covered by the spacer 42.1. This wet etch is selective with respect to the spacer 42.1, to the active layer 22 and to the n-doped lower layer 21. Thus, following this step, the active layer 22 has a surface free of any residual material 23.1 left over from the p-doped upper layer 23. This wet-etching step replaces the vertical over-etch that was intentionally not performed in the step of FIG. 2B to avoid degrading the active layer 22. This wet etch may be performed with a HCl base solution that is notably selective with respect to the InGaAsP of the active layer 22. Moreover, the p-doped InP is protected from the etchant by the spacer 42.1. Thus, an active layer 22 free of the residual material 23.1 is obtained, and hence it is now possible to perform a new dry-etching step.

Figure 2F:
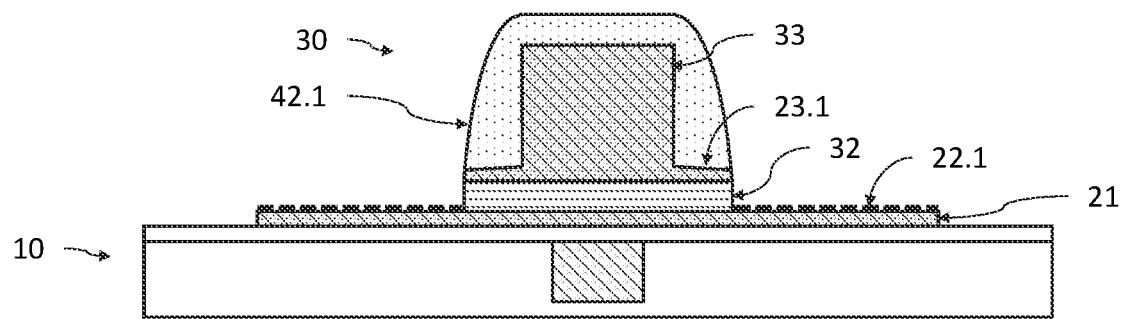

With reference to FIG. 2F, the active layer 22 is structured by dry etching, so as to form an active segment 32 the upper face of which is covered by the p-doped upper segment 33. Thus, the active layer 22 is etched locally in regions not protected by the spacer 42.1, with etching stopped on the n-doped lower layer 21. Etching is stopped when the InP of the n-doped lower layer 21 is detected. One portion of the active layer 22, i.e. all of it except the portion protected by the spacer 42.1, is thus removed.

As above, because of the non-uniformity in the etch depth of the dry etch employed, a residual lateral segment 22.1 of the InGaAsP material of the active layer 22 remains on the n-doped lower layer 21. In this example, this unetched residual segment 22.1 of the active layer 22 has been represented by dashed lines because of its small thickness, here of the order of 15 nm (5% of 300 nm). Intentionally, during this dry etch, it is chosen not to carry out a vertical over-etch to remove this residual segment 22.1, in order to avoid any degradation of the n-doped lower layer 21 (as this would have a negative impact on the access resistance associated with this lower layer 21).

Figure 2G:
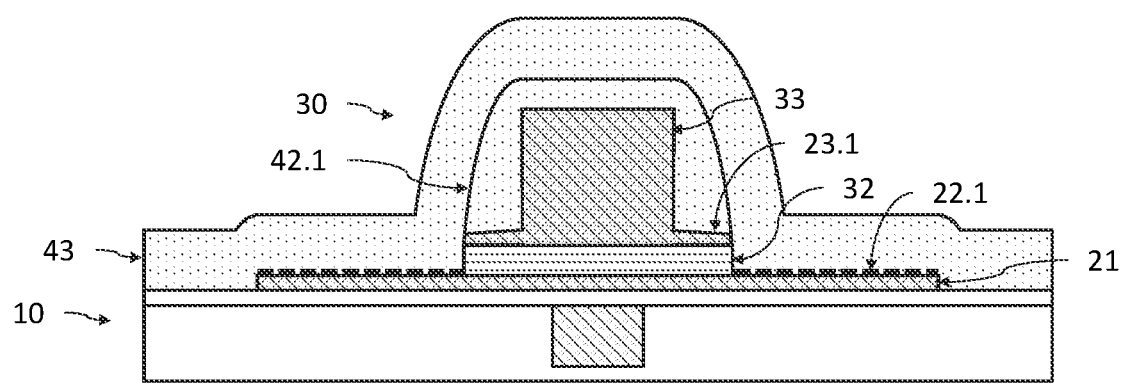

With reference to FIG. 2G, a second hard-mask layer 43 is deposited so as to continuously cover the spacer 42.1, the residual segment 22.1, the active layer 22 and the n-doped lower layer 21. A hard mask is used in so far as a second step of dry etching will subsequently be carried out. It may be made of a silicon nitride of a thickness comprised between 600 nm and 2 µm deposited by PECVD. The thickness of the hard-mask layer 43 is once again chosen to be smaller than the total thickness of the semiconductor pad 30 in the process of being produced. As a variant, the hard-mask layer 43 may be a bilayer formed from a SiN first sub-layer and from a second sub-layer of a tetraethyl orthosilicate (TEOS) or of a silane.

Figure 2H:
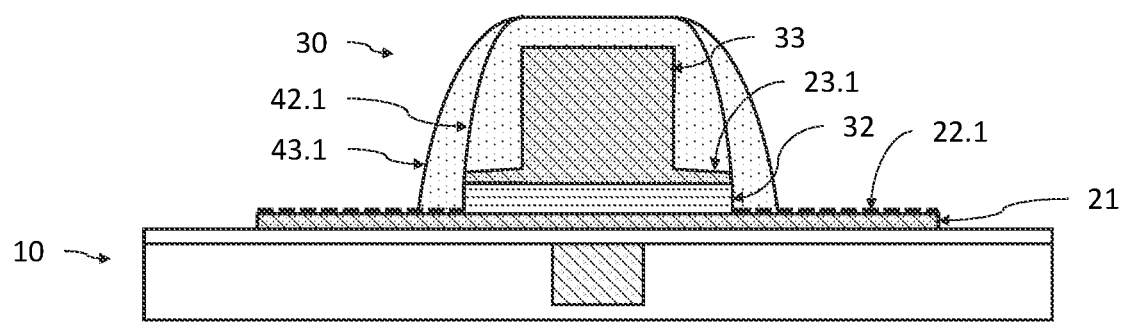

With reference to FIG. 2H, the second hard-mask layer 43 is then structured to form a second hard-mask segment 43.1, which is referred to as the second spacer, and which laterally encircles the spacer 42.1. It therefore extends at least over the sidewalls of the spacer 42.1, and covers only one portion of the residual segment 22.1 of the active layer 22. Another portion of the residual segment 22.1 of the active layer 22 has a free (uncovered) surface, and the n-doped lower layer 21 also has a free surface (at least the lateral surface). This step may be performed by dry etching the hard-mask layer 43, with etching stopped when the oxide of the functionalized substrate 10 and/or the InP of the n-doped lower layer 21 is detected. The spacer 43.1 is therefore preferably obtained via conformal deposition of the hard-mask layer 43, the latter having a thickness smaller than the cumulative thickness of the segments 32 and 33, followed by structuring with an anisotropic etch.

Figure 2I:
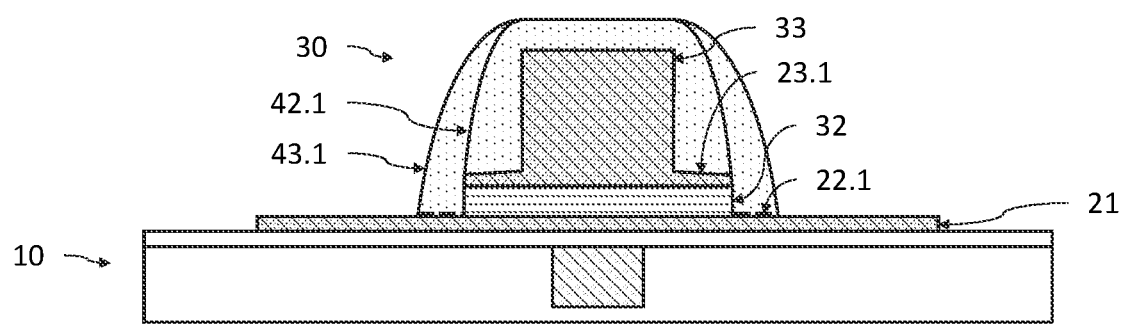

With reference to FIG. 2I, one portion of the residual segment 22.1 (i.e. the portion not protected by the spacer 43.1) is wet etched so as to free the surface of the n-doped lower layer 21 not covered by the spacer 43.1. This wet etch is selective with respect to the n-doped lower layer 21, and with respect to the spacers 42.1 and 43.1. Thus, following this step, the n-doped lower layer 21 has a surface free of any residual material 22.1 left over from the active layer 22. As above, this wet-etching step replaces the vertical over-etch that was intentionally not performed in the step of FIG. 2F to avoid degrading the n-doped lower layer 21.

Figure 2J:
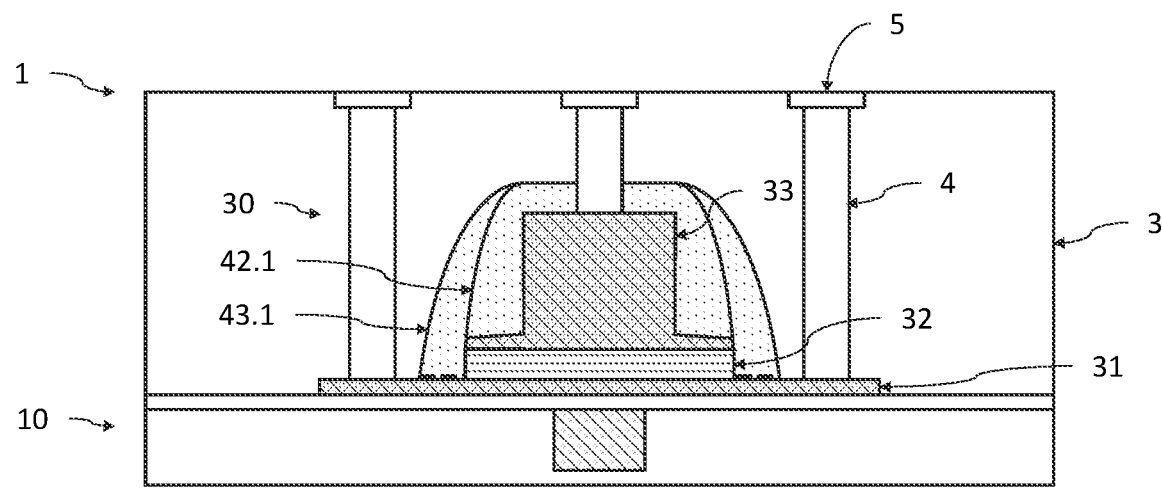

With reference to FIG. 2J, fabrication of the laser diode 1 is completed. To do so, the n-doped lower layer 21 is structured so as to obtain an n-doped lower segment 31 having a lateral dimension larger than the lateral dimension of the above segments 32 and 33. An encapsulating insulating layer 3 is deposited so as to entirely cover the semiconductor pad 30 and the spacers 42.1 and 43.1. Conductive vias 4 are produced that extend through the encapsulating layer 3 into contact with the n-doped lower segment 31 and the p-doped upper segment 33. It will be noted that contact metallizations (not shown) may have been produced beforehand (as in FIG. 1), on the lower and upper segments 31, 33, so as to improve the electrical contact with the conductive vias 4. Lastly, contact pads 5 may be produced on the surface of the encapsulating layer 3.

Thus, a laser diode 1 the semiconductor pad 30 of which has the desired vertical and lateral dimensions is obtained, this contributing to preserving the performance of the laser diode 1. As indicated above, the fabricating process employs dry-etching steps to structure the semiconductor stack 20 and to obtain a semiconductor pad 30 having the desired dimensions. Any undesired vertical etching that could degrade the subjacent layers is avoided, this causing unetched residual lateral segments 22.1 and 23.1 to form. Said segments are removed by wet etching, before the following dry etch is carried out.

Particular embodiments have just been described. Various variants and modifications will appear obvious to those skilled in the art, notably in the case where the semiconductor diode is a light-emitting diode or a photodiode.

The invention claimed is:

1. A process for fabricating a semiconductor diode, comprising the following steps:
   transfer of a semiconductor stack to a carrier substrate, comprising, starting from the carrier substrate: a lower layer doped with a first conductivity type dopant; an active layer comprising at least one quantum well; and an upper layer doped with a second conductivity type dopant opposite the first conductivity type dopant; and
   production, by local etching of the semiconductor stack, of a semiconductor pad comprising: a doped lower segment; an active segment having a lateral dimension smaller than that of the doped lower segment; and a doped upper segment having a lateral dimension smaller than that of the active segment, said production of the semiconductor pad comprising the following steps:
   depositing a first hard mask on the upper layer;
   forming the doped upper segment by dry etching the upper layer, with the dry etching of the upper layer stopped on the active layer, a lateral segment of the upper layer not entirely etched and forming a first residual segment resting on the active layer;
   forming a first spacer by depositing and structuring a second hard mask, the first spacer encapsulates the doped upper segment and leaves free an upper surface of the active layer and one portion of the first residual segment;
   wet etching the first residual segment selectively with respect to the active layer, freeing a surface of the active layer not covered by the first spacer;
   forming the active segment by dry etching the active layer, with the dry etching of the active layer stopped on the lower layer, a lateral segment of the active layer being not entirely etched and forming a second residual segment resting on the lower layer;
   forming a second spacer by depositing and structuring a third hard mask, the second spacer laterally encircles the first spacer and the active segment, and leaves free an upper surface of the lower layer and one portion of the second residual segment; and
   wet etching the second residual segment selectively with respect to the lower layer, freeing a surface of the lower layer not covered by the second spacer.

2. The fabricating process as claimed in claim 1, wherein the second hard mask and the third hard mask have, before they are structured, a thickness smaller than that of the semiconductor stack before the step of dry etching the upper layer.

3. The fabricating process as claimed in claim 1, comprising a step of locally etching the portion of the lower layer not covered by the second spacer to form the doped lower segment.

4. The fabricating process as claimed in claim 1, wherein the first, second, and third hard masks comprise silicon nitride.

5. The fabricating process as claimed in claim 1, wherein the second and third hard masks are made of a silicon nitride, or are formed of a bilayer comprising a silicon-nitride first sub-layer and a second sub-layer made of an oxide or of a silane.

6. The fabricating process as claimed in claim 1, wherein the semiconductor pad comprises a III-V compound, a II-VI compound, or a IV compound or element.

7. The fabricating process as claimed in claim 1, wherein the semiconductor pad comprises a III-V compound, and the carrier substrate is a silicon-on-insulator substrate.

8. The fabricating process as claimed in claim 1, wherein the semiconductor diode is a hybrid laser diode, and the semiconductor pad forms a waveguide optically coupled to an integrated waveguide located in the carrier substrate.

* * * * *